(12) United States Patent
Okada et al.

(10) Patent No.: US 7,589,661 B2
(45) Date of Patent: Sep. 15, 2009

(54) RADIO WAVE ABSORBER

(75) Inventors: Osamu Okada, Yokohama (JP); Toshiki Takizawa, Yokohama (JP); Naruhiko Mashita, Yokohama (JP); Takashi Ishiguro, Taito-ku (JP); Shinya Kusumi, Taito-ku (JP); Hiroshi Tsutagaya, Taito-ku (JP)

(73) Assignees: Bridgestone Corporation, Tokyo (JP); Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 11/861,937

(22) Filed: Sep. 26, 2007

(65) Prior Publication Data
US 2008/0180308 A1  Jul. 31, 2008

(30) Foreign Application Priority Data
Sep. 26, 2006 (JP) ............................. 2006-260801
Apr. 17, 2007 (JP) ............................. 2007-108432

(51) Int. Cl.
*H01Q 17/00* (2006.01)
*B32B 27/00* (2006.01)
*B32B 5/16* (2006.01)
*B32B 27/40* (2006.01)

(52) U.S. Cl. ......................................................... 342/1
(58) Field of Classification Search ...................... 342/1; 428/411.1, 402, 432, 446, 423.1
See application file for complete search history.

(56) References Cited

U.S. PATENT DOCUMENTS 6,136,429 A * 10/2000 Saito ........................... 428/323
6,207,003 B1 * 3/2001 McClure et al. ............. 156/291

FOREIGN PATENT DOCUMENTS

JP          2005-281732 A      10/2005

* cited by examiner

*Primary Examiner*—Dan Pihulic
(74) *Attorney, Agent, or Firm*—Sughrue Mion, PLLC

(57) ABSTRACT

A radio wave absorber that can be bonded securely to a flexible cable or a flexible printed circuit board eliminates the need for a release film. A radio wave absorber comprising a thermosetting adhesive sheet 1 that is cured into a flexible material, and a Sendust-containing curable resin composition layer 2 that is cured into a flexible material, wherein the curable resin composition layer is formed on either surface of the thermosetting adhesive sheet. The average particle diameter of Sendust is in the range of 30 to 100 μm. The content ratio of Sendust in the curable resin composition layer is in the range of 50 to 85 wt %.

13 Claims, 2 Drawing Sheets

RADIO WAVE ABSORBER

TECHNICAL FIELD

The present invention relates to a radio wave absorber that is bonded to a flexible electric or electronic component, such as a flexible printed circuit board including a flexible cable and a thin-layer semiconductor and prevents electromagnetic waves from leaking out of and penetrating instruments.

BACKGROUND ART

In current electronics, consumer instruments are being increasingly miniaturized, and flexible printed circuit boards constituting such instruments are accordingly getting smaller, thinner and more compact. Therefore, such flexible printed circuit boards should become lighter, thinner and more flexible, and the expanding applications of such products are requiring higher basic performance including thermostability and electric properties of materials used to manufacture such products. For example, the application of thin and elastic flexible printed circuit boards is necessary to maintain high flexibility and elasticity.

In particular, notebook computers have recently been getting smaller and thinner because of their versatility and high performance. Accordingly, bundled shielding wires, which have been used to form interface cables contained in an optical pickup device of hard-disk drives and DVD drives, are being replaced by flatter and thinner flexible printed circuit boards. Also, the frequencies used for digital signal transmission are getting higher so that data transmission rate is higher, and this demands higher electromagnetic-wave-shielding properties than ever before.

Examples of measures for shielding against electromagnetic waves include redesigning of the pattern of wiring serving as an antenna inside a flexible printed circuit board so as to prevent unnecessary radio waves from being emitted and covering a flexible printed circuit board with a radio wave absorber. The present invention relates to the latter, in other words, the application of a noise suppression sheet onto a flexible printed circuit board.

Japanese Unexamined Patent Application Publication No. 2005-281732 discloses a noise suppression sheet that is produced by orientational dispersion of flat particles of soft magnetic metal in a binding material so as to provide electromagnetic-wave-shielding properties.

Such a noise suppression sheet is formed of an organic resin such as chlorinated polyethylene for providing flame retardancy and flexibility, and then a silicone-type, acrylic-type or another type of adhesive layer is attached onto the backside thereof for applying the sheet onto a flexible printed circuit board.

Applied onto a printed circuit board, the noise suppression sheet described in Japanese Unexamined Patent Application Publication No. 2005-281732 starts to peel off from its edges especially in an ultra-slim drive or the like in which the curvatures of the flexible portions of cables are extremely small and the operating parts move fast. In the worst case, the sheet is completely removed from the board and may fall on the pickup device of a drive so as to interfere with the operation of the drive and to cover wires on the board, thereby causing problems which could lead to the occurrence of short-circuit.

Furthermore, the measures described above require a release film for protecting an adhesive portion, thus being costly and imposing a heavy load on the environment.

DISCLOSURE OF INVENTION

The present invention provides a radio wave absorber that can be bonded securely to a flexible cable or a flexible printed circuit board and uses no release film so as to resolve the problems accompanied by known technologies.

The radio wave absorber according to the present invention comprises a thermosetting adhesive layer that is cured into a flexible material through heating or other treatments, and a curable resin composition layer containing magnetic particles of a metal or a metal oxide that is cured into a flexible material through heating or other treatments, wherein the curable resin composition layer is formed on either surface of the thermosetting adhesive layer.

DETAILED DESCRIPTION OF THE INVENTION

Figure 1:
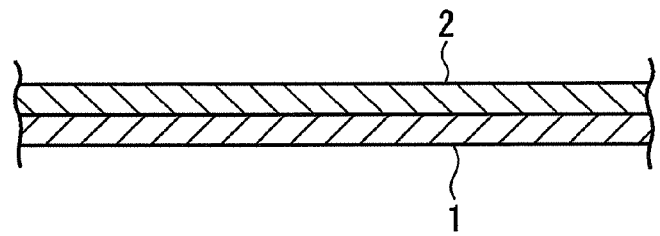
FIG. 1 is a sectional view of the radio wave absorber according to the embodiment described below.

The radio wave absorber according to the present invention comprises a thermosetting adhesive layer that is cured into a flexible material as well through a heat processing or other treatments, and a curable resin composition layer containing magnetic particles of a metal or a metal oxide that is cured into a flexible material as well through a heat processing or other treatments, wherein the curable resin composition layer is formed on either surface of the thermosetting adhesive layer.

In the present invention, the thermosetting adhesive layer preferably has some tackiness.

The average particle diameter of Sendust is preferably in the range of 30 to 100 μm. Also, the content ratio of Sendust in the curable resin composition layer is preferably in the range of 50 to 85 wt %.

The thickness of the thermosetting adhesive layer is preferably in the range of 10 to 100 μm, whereas the thickness of the curable resin composition layer is preferably in the range of 100 to 500 μm.

The curable resin composition layer is preferably formed of a nonsolvent-type, curable liquid composition containing Sendust. This curable liquid composition preferably contains modified-silicone-type, silicone-type, urethane-type or polyisobutylene-type polymer.

In the radio wave absorber according to the present invention, the hardness of the thermosetting adhesive sheet and the curable resin composition measured after they are cured through heating (JIS K6253 (Type A)) is preferably in the range of 20 to 50°.

Preferably, a laminated film obtained by combining a second adhesive layer and a metal layer is mounted on the above-mentioned curable resin composition layer. The second adhesive layer is preferably formed of a thermoplastic resin or a thermosetting resin, and the metal layer is preferably an aluminum thin layer.

Preferably, an insulating layer is attached onto the surface of the metal layer that is not facing the second adhesive layer.

Preferably, a metal layer is attached onto the curable resin composition layer.

The radio wave absorber according to the present invention has a thermosetting adhesive layer and a curable resin composition layer formed thereon that contains magnetic particles of a metal or a metal oxide. Covering a flexible printed circuit board such as a flexible cable with this thermosetting adhesive layer and then heating or heat-pressing the thermosetting adhesive layer bonds the radio wave absorber securely to the flexible printed circuit board such as a flexible cable.

Both the thermosetting adhesive layer and the curable resin composition layer acquire flexibility after being cured, and thus the resulting radio wave absorber will be flexible and excellent in resistance to bending. In addition, the use of particles of a magnetic metal such as Sendust as the magnetic particles can improve the radio-wave-absorbing performance.

The present invention uses the thermosetting adhesive layer as a layer for adhesion instead of a conventional adhesive agent layer, thereby providing the thermal-compression-bonding capability (heat-sealing capability) that allows, for example, to prevent a noise suppression sheet that has been applied onto a flexible printed circuit board constituting an optical pickup device of an optical disk drive (ODD) installed in a slim notebook computer from peeling off of or removed from the board. This can improve the applicability of flexible printed circuit boards in a wide variety of areas in electronics. Furthermore, the thermosetting adhesive layer does not always have to be covered with a release film, which is necessary when using the adhesive agent layer, and the reduction of waste materials such as the release film leads to a less load being imposed on the environment. Moreover, this radio wave absorber integrates the thermosetting adhesive layer and the curable resin composition layer containing magnetic particles of a metal or a metal oxide and thus the thermosetting adhesive layer and the layer containing magnetic particles of a metal or a metal oxide (radio-wave-absorbing layer) can be simultaneously produced. In addition, the present invention also allows the radio wave absorber to be applied onto a flexible printed circuit board and a flexible cable at the time of production, thus being cost-effective.

When the average particle diameter of the magnetic particles of a metal or a metal oxide is in the range of 30 to 100 μm and the content ratio of Sendust in the curable resin composition layer is in the range of 50 to 85 wt %, the curable resin composition layer containing the magnetic particles of a metal or a metal oxide can be formed into a thin and uniform layer, and at the same time, the cured material obtained by curing the curable resin composition becomes sufficiently flexible. Also, the curable resin composition layer has no adhesive property (stickiness) so as to be handled with ease.

When the thermosetting adhesive layer is in the range of approximately 10 to 100 μm and the curable resin composition layer containing magnetic particles of a metal or a metal oxide is approximately 100 to 500 μm, the cured radio wave absorber becomes sufficiently flexible and excellent in resistance to bending.

When cured, the radio wave absorber of the present invention may have the hardness according to JIS K6253 (Type A) being in the range of 20 to 50°.

In addition, when the thermosetting adhesive layer of the radio wave absorber according to the present invention has some tackiness, the radio wave absorber can be temporarily fixed on a flexible cable or a flexible printed circuit board prior to being bonded, and thus the processability in the bonding step can be improved.

The curable resin composition layer of the radio wave absorber according to the present invention is preferably formed of a nonsolvent-type, curable liquid composition, in particular, a curable liquid composition containing modified-silicone-type, silicone-type, urethane-type or polyisobutylene-type polymer.

Mounting a laminated film obtained by combining a second adhesive layer and a metal layer on the curable resin composition layer of the radio wave absorber according to the present invention or placing a metal layer on the curable resin composition layer can further improve the shielding effect. Preferably, an insulating layer is attached onto the surface of the metal layer that is not facing the second adhesive layer.

Preferable embodiments of the present invention are described in detail below with reference to drawings.

A preferable radio wave absorber according to the present invention has, as shown in FIG. 1, a thermosetting adhesive layer 1 and a curable resin composition layer 2 containing magnetic particles of a metal or a metal oxide, which is formed on either surface of the thermosetting adhesive layer 1.

Examples of the thermosetting adhesive layer 1 include a thermosetting urethane sheet and a thermosetting epoxy resin sheet.

This thermosetting adhesive layer 1 preferably has some tackiness at temperatures from room temperature to one at which the layer is subjected to bonding step, approximately 150° C. More preferably, the thermosetting adhesive layer maintains its tackiness even at a temperature for temporary fixation (100° C.).

Examples of the thermosetting adhesive sheet satisfying such requirements include TSU4 (urethane-type) manufactured by Toyo Ink MFG. Co., Ltd.

When formed too thin, this thermosetting adhesive layer becomes poor in adhesive strength. On the other hand, when formed too thick, the radio-wave-absorbing performance is degraded because of the distance between the magnetic-metal-particle-containing curable resin composition layer and the flexible printed circuit board or the like to which the layer is bonded. Therefore, the thickness of the thermosetting adhesive layer is preferably in the range of 10 to 100 μm, and more preferably, in the range of approximately 10 to 50 μm.

A curable resin constituting the Sendust-containing curable resin composition layer, which is formed on this thermosetting adhesive layer 1, is preferably a nonsolvent-type, curable liquid composition consisting of modified-silicone-type, silicone-type, urethane-type, polyisobutylene-type, or another type of polymer, with a modified silicone resin being particularly preferable. Preferably, the hardness of the curable liquid composition measured after the composition is cured (JIS K6253 (Type A)) is in the range of approximately 20 to 50°.

Among modified silicone resins, a polyoxyalkylene resin that contains at least one hydrolysable silicon molecule, such as "MS Polymer S810" (manufactured by Kaneka Corporation), is preferable. However, a polyisobutylene resin that contains at least one hydrolysable silicon molecule, such as "Epion S-type" (manufactured by Kaneka Corporation), or a polyacrylic resin that contains at least one hydrolysable silicon molecule may be employed instead.

As for the production of a polyoxyalkylene resin containing at least one hydrolysable silicon-containing group, a lot of methods are available and any one of the methods may be used without any particular limitation. For example, the method described in Japanese Unexamined Patent Application Publication No. 2001-55438 may be used to produce such a resin.

More specifically, to produce cross-linked, silicon-group-containing polyoxyalkylene polymer, the mixture of a monoepoxide containing three or more carbon atoms and no unsaturated group and another monoepoxide containing an unsaturated group is polymerized by an epoxide-polymerization catalyst in the presence of a polymerization initiator so as to form polyoxyalkylene polymer containing the unsaturated group, and then the unsaturated group is converted into a hydrolysable silicon-containing group.

Any known epoxide-polymerization catalyst may be used without any particular limitation as long as it can catalyze the polymerization by opening an epoxy group. Specific examples of such a catalyst include alkali metals such as sodium and potassium, alkali metal hydroxides such as sodium hydroxide, potassium hydroxide and cesium hydroxide, aluminum-porlephyrin complexes, phosphazenium compounds and double metal cyanide complexes.

The polymerization reaction of monoepoxides using one of the epoxide-polymerization catalysts described above may be performed without any solvent or with THF or other solvent.

Examples of the monoepoxide containing three or more carbon atoms and no unsaturated group include, but are not limited to, aliphatic alkylene oxides such as propylene oxide, 1,2-butene oxide, 2,3-butene oxide and epichlorhydrin, and aromatic alkylene oxides such as styrene oxide. An aliphatic alkylene oxide is preferable, and propylene oxide is particularly preferable.

Examples of the monoepoxide containing an unsaturated group include (meth)allyl glycidyl ether, glycidyl (meth)acrylate, butadiene monoxide, cyclopentadiene monoepoxide. (Meth)allyl glycidyl ether is preferable, and ally glycidyl ether is particularly preferable.

The composition ratio (molar ratio) of the mixture (mixed monomers) of the monoepoxide containing three or more carbon atoms and no unsaturated group and the other monoepoxide containing an unsaturated group is preferably in the range of 50:1 to 1:10, more preferably in the range of 20:1 to 1:5, and the most preferably in the range of 10:1 to 1:2. The closer to the end the position to introduce the unsaturated group is, the better the elastic characteristics of the resulting polymer containing a hydrolysable silicon group are observed after the polymer is cured. Therefore, the content ratio of the monoepoxide containing an unsaturated group is preferably high.

The unsaturated group contained in the thus-obtained unsaturated-group-containing polyoxyalkylene polymer can be converted into a hydrolysable silicon group through the hydrosilylation reaction with a compound containing both a hydrosilyl group and a hydrolysable silicon group in one molecule thereof. In this way, the polyoxyalkylene polymer that has hydrolysable silicon groups near its end at a high content ratio and exhibits excellent elastic characteristics after being cured is obtained.

The kind of the compound containing both a hydrosilyl group and a hydrolysable silicon group in one molecule thereof is not particularly limited, but the compound expressed by the following general formula (I) can be easily obtained and thus is preferable.

$$H\text{—}Si(R^1{}_{3-a})X_a \quad (I)$$

[In this formula, $R^1$ represents an alkyl group having one to twenty carbon atoms, an aryl group having six to twenty carbon atoms, an aralkyl group having seven to twenty carbon atoms or a triorganosiloxy group expressed by $(R')_3SiO\text{—}$, where R' represents a monovalent hydrocarbon group having one to twenty carbon atoms and three R's may be identical to or different from each other. X represents a hydroxyl group or other hydrolysable groups, and if the number of the group X is two or larger, the hydrolysable groups may be identical to or different from each other. The numeral a is 0, 1, 2 or 3.]

Any known hydrolysable group may be used as the group X described above without any particular limitation. Specific examples include the hydrogen atom, halogen atoms, alkoxy groups, acyloxy groups, ketoximate groups, amino groups, amide groups, acid amide groups, aminooxy groups, mercapto groups, alkenyloxy groups. Among these atoms and groups, alkoxy groups such as a methoxy group, an ethoxy group, a propoxy group and an isopropoxy group are preferable since they are easy to handle because of their mild hydrolytic activity.

Specific examples of the compound expressed by the general formula (I) described above include halogenated silanes such as trichlorosilane, methyldichlorosilane, dimethylchlorosilane, phenyldichlorosilane, trimethylsiloxymethylchlorosilane and 1,1,3,3-tetramethyl-1-bromodisiloxane; alkoxysilanes such as trimethoxysilane, triethoxysilane, methyldiethoxysilane, methyldimethoxysilane, phenyldimethoxysilane, trimethylsiloxymethylmethoxysilane and trimethylsiloxydiethoxysilane; acyloxysilanes such as methyldiacetoxysilane, phenyldiacetoxysilane, triacetoxysilane, trimethylsiloxymethylacetoxysilane and trimethylsiloxydiacetoxysilane; ketoxymatesilanes such as bis(dimethylketoxymate)methylsilane, bis(cyclohexylketoxymate) methylsilane, bis(diethylketoxymate)trimethylsiloxysilane, bis(methylethylketoxymate)methylsilane and tris(acetoxymate)silane; and alkenyloxysilanes such as methylisopropenyloxysilane. Among these compounds, alkoxysilanes such as methyldimethoxysilane, trimethoxysilane, methyldiethoxysilane and triethoxysilane; halogenated silanes such as trichlorosilane and methyldichlorosilane are more preferable, and methyldimethoxysilane and trimethoxysilane are the most preferable. Halogen atoms contained in the halogenated silanes may be subjected to the hydrosilylation reaction with the unsaturated group and subsequently converted into another kind of hydrolysable group through the reaction with an active hydrogen compound such as carboxylic acid, oxime, amide and hydroxylamine, an alkali metal enolate of a ketone or the like according to a known method.

The compound containing both a hydrosilyl group and a hydrolysable silicon group in one molecule thereof is preferably reacted with each end of the molecular chains of the polyoxyalkylene polymer at an amount ranging from 0.5 to 5 equivalent weight. To maintain the balance between the curing characteristics and the physical properties, the amount is more preferably in the range of 0.6 to 4 equivalent weight, and the most preferably in the range of 0.7 to 3 equivalent weight.

Furthermore, as the catalyst for reacting the unsaturated-group-containing polyoxyalkylene polymer with the compound containing both a hydrosilyl group and a hydrolysable silicon group in one molecule thereof, a metal complex catalyst selected from transition metal elements belonging to the IX or X group, such as platinum, rhodium, cobalt, palladium and nickel, or other similar catalysts can be effectively used.

The thus-obtained hydrolysable-silicon-group-containing polyoxyalkylene polymer forms a hard, cross-linked material when reacted with water or moisture in the air.

The molecular weight of the modified silicone resin is preferably in the range of 3000 to 50000 when expressed by the number average molecular weight of polystyrene measured in a GPC method, but not limited to this range. The resin having the number average molecular weight falling within the abovementioned range would provide a hard material displaying excellent elastic characteristics and the polymer with an adequate viscosity, thereby being favorable also in the ease in implementation. Furthermore, the modified silicone resin should be in a liquid state at room temperature, so that the number average molecular weight being in the range of 5000 to 50000 is particularly preferable to meet the viscosity requirements.

The number of the hydrolysable silicon groups the modified silicone resin contains at each end of the chain is at least one, and preferably in the range of 1.2 to 4. The number of the hydrolysable silicon groups falling within the abovementioned range allows the resulting polymer to be cured to a sufficient degree and to acquire flexibility and elasticity. In addition, the presence of the hydrolysable silicon group at each end of the chain increases the amount of effective linking chains in the polymer component contained in the resulting hard material, thereby facilitating the production of an elastic hard material showing high strength and high elongation properties.

The abovementioned modified silicone resin has some tackiness, so that the position of the radio wave absorber is determined when the absorber is placed on the thermosetting adhesive sheet or a flexible printed circuit board such as a flexible cable, and the subsequent pressure-bonding step thus can be performed efficiently.

Meanwhile, the present invention preferably contains a metal carboxylate and/or an amine compound as the catalyst for curing the modified silicone resin.

Examples of the metal carboxylate include tin carboxylates such as dibutyltin dilaurate, dibutyltin maleate, dibutyltin diacetate, tin octylate and tin naphthenate.

Also, examples of the amine compound include butylamine, monoethanolamine, triethylenetetramine, guanidine, 2-ethyl-4-methylimidazole, 1,3-diazabicyclo(5.4.6)undecene-7 (DBU).

The amount of such a curing catalyst can be appropriately determined based on the kind of the catalyst, the amount of hydrolysable silicon groups and other conditions.

The curable resin composition used in the present invention may contain, if necessary, at least one selected from the group consisting of a light stabilizer (D1), an ultraviolet-absorbing agent (D2) and an antioxidizing agent (D3).

The light stabilizer (D1) is preferably a hindered amine-containing agent, a radical scavenger, whereas the ultraviolet-absorbing agent (D2) may be a salicylate-, hydroxybenzophenone- or benzotriazole-containing agent.

Examples of the antioxidizing agent (D3) include quinone-, amine-, phenol-, phosphorous- and sulfur-containing agents.

In the present invention, one of the abovementioned (D1), (D2) and (D3) may be used alone, or the (D1), (D2) and (D3) may be appropriately combined prior to use.

The addition of such additives further improves the light resistance and the weather resistance of the resulting electromagnetic wave absorber.

In general, the content ratio of the abovementioned (D1), (D2) and (D3) in 100 parts by weight of the polymer component is in the range of approximately 0.05 to 5 parts by weight each, and more preferably, in the range of 0.1 to 3 parts by weight.

Moreover, the present invention preferably contains a plasticizer (F) without any functional group that can react with a resin component such as the modified silicone resin at a content ratio ranging from 1 to 100 parts by weight relative to 100 parts by weight of the resin component.

Examples of the plasticizer, the component (F), include polyalkylene plasticizers such as polybutene, hydrogenated polybutene, ethylene-α-olefin cooligomer, α-methylstyrene oligomer, biphenyl, triphenyl, triaryldimethane, alkylenetriphenyl, liquid polybutadiene, hydrogenated liquid polybutadiene, alkyldiphenyl and partially-hydrogenated terphenyl; paraffin plasticizers; naphthene plasticizers; phthalate plasticizers such as dibutylphthalate, diheptylphthalate, di(2-ethylhexyl)phthalate, butylbenzylphthalate and butylphthalylbutylglycolate; aliphatic dibasic acid ester plasticizers such as dioctyladipate and dioctylsebacate; acrylic plasticizers; polyalkylene glycol ester plasticizers such as diethylene glycol benzoate, triethylene glycol benzoate; and phosphate plasticizers such as tricresylphosphate and tributylphosphate. Among these compounds, saturated hydrocarbon compounds are particularly preferable. These plasticizers may be used separately or in combination of two or more kinds. Also, these plasticizers may be used instead of solvent in order to adjust the reaction temperature and the viscosity of the reaction system or for other purposes during the introduction of reactive silicon groups into saturated-hydrocarbon-type organic polymer.

In the present invention, the curable resin composition layer contains magnetic particles of a metal or a metal oxide. Preferable examples of such magnetic particles of a metal or a metal oxide include particles of a magnetic metal such as Sendust, Permalloy, an amorphous alloy or stainless steel, or a metal oxide such as Mn—Zn ferrite and Ni—Zn ferrite. Among these magnetic particles, the magnetic metal particles containing Sendust is particularly preferable because of the excellent magnetic properties thereof. Preferably, each Sendust particle is flat in shape and has a sufficiently high aspect ratio. The average particle diameter of the magnetic particles such as Sendust is preferably in the range of 30 to 100 μm. If this average particle diameter is smaller than 30 μm or larger than 100 μm, the mixture of the magnetic particles and a curable resin does not have flexibility sufficient for smooth expansion, thus making it difficult to form a thin and uniform layer of the mixture on the thermosetting adhesive layer.

Preferably, the magnetic particles of a metal or a metal oxide are contained in the curable resin composition so that the content ratio thereof is in the range of approximately 50 to 85 wt %. If the content ratio of the magnetic particles of a metal or a metal oxide is lower than 50 wt %, the resulting curable resin composition layer becomes lack in radio-wave-absorbing performance and contains an excess relative amount of a resin component, thereby being difficult to handle because of stickiness (adhesive property). On the other hand, if the content ratio of the magnetic particles of a metal or a metal oxide is higher than 85 wt %, the mixture of the curable resin and the magnetic particles of a metal or a metal oxide becomes lack in the expansion property, and the flexibility of the magnetic-particle-containing curable resin composition layer 2 is also degraded.

Although there is no particular limitation on the kneading machine for mixing the resin component and the magnetic particles of a metal or a metal oxide, a planetary mixer is preferable. Such a planetary mixer provides excellent performance in stirring and mixing a liquid and particles. Two blades of the planetary mixer moves in an orbital path while rotating like a planet (planetary movement) so that the intervals between the blades and each blade and the inner wall of the tank become as small as possible. This substantially eliminates dead spaces and thus ensures a good kneading (stirring, mixing and dispersing) effect.

When performing this step of mixing the resin component and the magnetic particles of a metal or a metal oxide, it is preferable to employ the split-charging method, in which the magnetic particles of a metal or a metal oxide is added in twice or more. This split-charging method enables dispersing the magnetic particles of a metal or a metal oxide in a resin sufficiently. In practice, it is preferable that the magnetic particles of a metal or a metal oxide at an amount ranging from ⅓ to ⅔ of the total amount is first added into and mixed with a resin, then the remaining amount is added in twice to four times preferably with the amount added being substantially identical between each charging.

The curable composition obtained by mixing the magnetic particles of a metal or a metal oxide with a resin is amorphous in its uncured state, and applied onto the thermosetting adhesive layer. The composition contains a curing catalyst. A one-component composition is hardened by moisture in the air or the like after being applied, whereas a two-component composition is hardened when the composition is mixed with the curing catalyst. When using the latter composition, preferably, the curing catalyst is added into and mixed with a resin composition immediately before the application of the curable resin composition layer onto the thermosetting adhesive layer. The curable resin composition layer is formed by applying the abovementioned resin composition onto the thermosetting adhesive layer with a bar coater, a doctor blade or other means.

The curable resin composition layer can be used as a non-solvent-type coating material, a coating material not containing an organic solvent, taking into account the effect of the organic solvent on environment, safety and hygiene. However, an organic solvent may be added into the layer so as to reduce the viscosity for the improved smoothness in coating. Examples of the organic solvent used include ethyl acetate, xylene and toluene, and the content ratio thereof is typically in the range of 0.5 to 50%, and preferably in the range of 1 to 20%. When the content ratio is not higher than 0.5%, the smoothness in coating is hardly improved, but when the content ratio is not lower than 50%, the smoothness in coating is rather degraded because of the loss of solid content.

The thicker the magnetic-particle-containing curable resin composition layer formed in the application step is, the better the radio-wave-absorbing performance thereof is. Therefore, when the layer is too thin, sufficient absorbing performance can not be achieved. On the other hand, when the layer is too thick, the layer is too heavy and less flexible, thus being difficult to be applied onto a flexible printed circuit board or the like.

Figure 2:
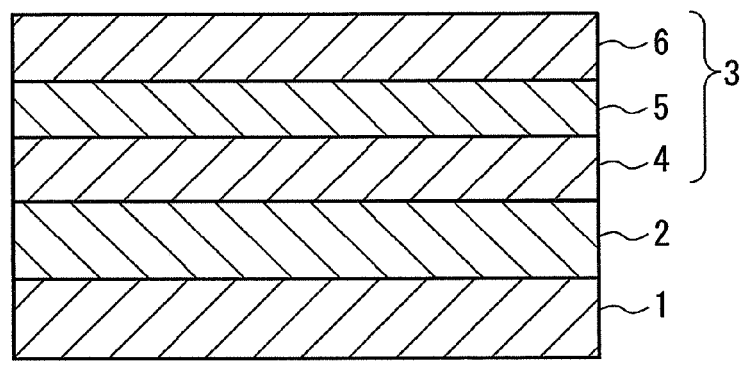
FIG. 2 is a sectional view of the radio wave absorber according to another embodiment.

FIG. 2 shows a variation of the structure of the present invention shown in FIG. 1. The radio wave absorber shown in FIG. 2 has a structure in which a laminated film 3 is placed on the curable resin composition layer 2 shown in FIG. 1. The laminated film 3 has a laminated structure achieved by combining a second adhesive layer 4, a metal layer 5 and an insulating layer 6.

The second adhesive layer 4 is formed of a heat-adhesive material, such as an EMMA (an ethylene resin) film. However, another known heat-adhesive material (such as a polyimide resin or CPP (cast polypropylene)) may be used considering the compatibility with the curable resin composition layer 2 used as a substrate. In Examples, EMMA described above was used to form the second adhesive layer 4 having a thickness of 30 μm.

As the abovementioned metal layer 5, a metal thin film formed through a vapor-deposition or plating technique is used. In Examples, a vapor-deposited aluminum thin film was used as the metal layer 5, and the thickness of the aluminum thin film was 400 Å. Reducing the thickness of the metal layer 5 would allow the metal layer 5 to act as a resistive film, thereby leading to improved electromagnetic-wave-absorbing performance.

The insulating layer 6 is laminated on the remaining major surface of the abovementioned metal layer 5. Although a CPP (cast polypropylene) film having a thickness of 20 μm was used as the insulating layer 6 in Examples, another known insulating material may also be used instead. For instance, an organic material such as PET, PE and PI or an inorganic film such as $SiO_2$ coating or SiN may be used. The insulating layer 6 can be formed through vapor-deposition, sputtering or other known wet film-forming methods. In addition, the resistance of the insulating layer 6 is equal to or higher than $10^6$ Ω/cm. This is because a resistance being lower than $10^6$ Ω/cm may cause short-circuit to occur because of the lack in the insulation property when a wiring is placed on the insulating layer.

The abovementioned laminated film 3 can be prepared by, for example, forming the metal layer 5 (an aluminum thin film) on the insulating layer 6 through vapor-deposition and then laminating the second adhesive layer 4 thereon in a laminating process.

The addition of the laminated film 3 to the structure shown in FIG. 1 results in incident electromagnetic waves being partly shielded by the laminated film. Therefore, the electromagnetic-wave-absorbing performance and the shielding performance can be improved compared to those achieved by the structure shown in FIG. 1.

EXAMPLES

Example 1

A radio wave absorber for a flexible cable was prepared from the materials described in i) below in accordance with the method described in ii). The radio wave absorber was bonded to a flexible cable following the procedures described in iii). After that, the radio wave absorber was characterized according to the measurement and evaluation methods described in iv). The results are shown in Table 1.

i) Materials (Refer to Table 1 for Composition.)

Polymer: MS Polymer S810 Manufactured by Kaneka Corporation

Plasticizer: Diisononyl Phthalate

As the magnetic particles of a metal or a metal oxide, Sendust-containing magnetic metal particles were prepared as follows. An attrition mill (sold under a trade name of Attritor) was used to pulverize the particles of Fe—Si—Al alloy (Sendust) in which the content ratio of Si and Al was 9.6 wt % and 5.5 wt %, respectively, and the balance was Fee, and as a result, flat particles were obtained. The particle diameter was modified by changing the pulverization time.

The average particle diameters $D_{50}$ (μm) measured using a laser diffraction technique are shown in Table 1.

As a curing agent, Nikka Octhix Tin manufactured by Nihon Kagaku Sangyo Co., Ltd. was added so as to account for 0.05 phr of the entire polymer prior to the application of the polymer.

As the thermosetting adhesive layer, a commercially available thermosetting adhesive sheet (with stickiness), TSU4 (an urethane resin sheet having a thickness of 35 μm) manufactured by Toyo Ink MFG. Co., Ltd., was used.

ii) Production Method

The polymer, the plasticizer and a half amount of the Sendust were put into a planetary mixer at a temperature of 50° C. and mixed for 10 minutes, and then the step of adding a quarter amount of the Sendust and kneading the mixture for 10 minutes was repeated twice to produce a liquid composition.

The obtained liquid composition was applied onto the abovementioned adhesive sheet using a bar coater and was allowed to stand for at least 24 hours under the air at room temperature until it was cured. As a result, the radio wave absorber consisting of a laminated body of a radio-wave-absorbing body and a thermosetting adhesive sheet was obtained. The amounts applied are shown in Table 1 by the total thickness of the radio wave absorber.

iii) Bonding to a Flexible Cable

The thus-prepared radio wave absorber was bonded to a flexible cable by heat-pressing under the conditions of 2-minute temporary fixation at a temperature of 100° C. with the pressure being 1 MPa followed by heating in an oven at 150° C. for 3 hours.

iv) Methods for Measurement and Evaluation of Characteristics

[Dispersity]

Fluidity was visually inspected and classified into the following two scores: (○) the mixture was a liquid having some fluidity; (x) the mixture had less fluidity.

[Sheet Processability]

Appearance was observed and classified into the following two scores: (○) no defect was observed in the sheet having a thickness of 100 to 200 μm; (x) some defects such as unevenness were observed in the sheet having a thickness of 100 to 200 μm.

[Hardness]

Hardness was measured according to JIS K6253 (Type A).

[Stickiness of the Curable Resin Composition Layer]

The presence of stickiness was evaluated by touching. In the case any stickiness was felt, the score was (x).

[Radio Wave Absorption Ratio]

The absorbing performance of the sheet placed on a microstrip line was measured according to the following equation: Absorption ratio=Power loss/Power input. The size of the sheet was 50×50 mm, and the frequency used was 1 GHz.

[Tackiness Strength]

The adhesive sheet and a polyimide film were pressure-bonded to each other, and the load required for removing one from the other was measured using BICMA TACK TESTER II manufactured by Toyo Seiki Seisaku-Sho, Ltd. The time of pressure bonding was 10 seconds, and the load for pressure bonding was 100 g.

[Positioning Accuracy of the Adhesive Sheet]

The abovementioned radio wave absorber consisting of a laminated body of the radio-wave-absorbing body and the thermosetting adhesive sheet was tested during the temporary fixation to a flexible cable, and classified into the following two scores: (○) the radio wave absorber could be attached on a predetermined position; (x) the radio wave absorber could not be attached on a predetermined position.

[Resistance to Bending]

The radio wave absorber was repeatedly bent by 1800 under conditions where the frequency was 1 Hz, the amplitude was ±20 mm and the curvature radius was 2 mm. The absorbers in which no defect was observed even after being bent a million times was rated as (○).

Examples 2 to 4

The radio wave absorber was prepared and evaluated in a similar way to that described in Example 1 except that the content ratio of Sendust was increased stepwise as shown in Table 1 and the thickness of the radio wave absorber was modified. The results are shown in Table 1.

Comparative Example 1

The radio wave absorber was prepared and evaluated in a similar way to that described in Example 1 except that the content ratio of Sendust in the curable resin composition was reduced to 45 wt % (117 phr). The results are shown in Table 1.

In addition, the radio wave absorber had a thickness of 0.25 mm as shown in Table 1, thus being slightly thinner than Example 1 (0.27 mm).

Comparative Example 2

The radio wave absorber was prepared and evaluated in a similar way to that described in Example 4 except that the whole amount of Sendust was charged at one time during the step of kneading the resin and the Sendust. The results are shown in Table 1.

Comparative Example 3

The radio wave absorber was prepared and evaluated in a similar way to that described in Example 4 except that the average particle diameter of the Sendust was reduced to 23.8 μm. The results are shown in Table 1.

Comparative Example 4

The radio wave absorber was prepared and evaluated in a similar way to that described in Example 4 except that the average particle diameter of the Sendust was increased to 110 μm. The results are shown in Table 1.

Comparative Example 5

The radio wave absorber was prepared and evaluated in a similar way to that described in Example 4 except that TSU8 (an urethane resin sheet having the same thickness as that of TSU4) manufactured by Toyo Ink MFG. Co., Ltd., which had no tackiness, was used as the thermosetting adhesive layer.

The results are shown in Table 1.

Comparative Example 6

The radio wave absorber was prepared and evaluated in a similar way to that described in Examples 1 to 4 except that the content ratio of Sendust was increased to 85.6 wt % (850 phr). The results are shown in Table 1.

TABLE 1

|  | Comparative Example 1 | Example 1 | Example 2 | Example 3 | Example 4 |
|---|---|---|---|---|---|
| Polymer (phr) | 100 | 100 | 100 | 100 | 100 |
| Plasticizer (phr) | 43 | 43 | 43 | 43 | 43 |

TABLE 1-continued

|  | Example 1 | Example 2 | Example 3 | Example 4 | Comparative Example 1 |
|---|---|---|---|---|---|
| Sendust (phr) | 117 | 143 | 174 | 214 | 266 |
| Sendust (wt %) | 45 | 50 | 55 | 60 | 65 |
| Average particle diameter $D_{50}$ (μm) | 63 | 63 | 63 | 63 | 63 |
| Kneading method | Split-charging | Split-charging | Split-charging | Split-charging | Split-charging |
| Dispersity of Sendust | ◯ | ◯ | ◯ | ◯ | ◯ |
| Processability of radio wave absorber | ◯ | ◯ | ◯ | ◯ | ◯ |
| Hardness of radio wave absorber | 27 | 29 | 30 | 34 | 40 |
| Thickness of radio wave absorber (mm) | 0.25 | 0.27 | 0.392 | 0.23 | 0.285 |
| Stickiness of radio wave absorber | X | ◯ | ◯ | ◯ | ◯ |
| Radio wave absorption ratio | 0.12 | 0.15 | 0.2 | 0.15 | 0.22 |
| Tackiness of thermosetting adhesive sheet | Present | Present | Present | Present | Present |
| Tackiness strength of thermosetting adhesive sheet (N) | 0.67 | 0.67 | 0.67 | 0.67 | 0.67 |
| Positioning accuracy of adhesive sheet | ◯ | ◯ | ◯ | ◯ | ◯ |
| Resistance to bending | ◯ | ◯ | ◯ | ◯ | ◯ |

|  | Comparative Example 2 | Comparative Example 3 | Comparative Example 4 | Comparative Example 5 | Comparative Example 6 |
|---|---|---|---|---|---|
| Polymer (phr) | 100 | 100 | 100 | 100 | 100 |
| Plasticizer (phr) | 43 | 43 | 43 | 43 | 43 |
| Sendust (phr) | 266 | 266 | 266 | 266 | 850 |
| Sendust (wt %) | 65 | 65 | 65 | 65 | 85.6 |
| Average particle diameter $D_{50}$ (μm) | 63 | 23.8 | 110 | 63 | 63 |
| Kneading method | Batch-charging | Split-charging | Split-charging | Split-charging | Split-charging |
| Dispersity of Sendust | Δ | X | Δ | ◯ | X |
| Processability of radio wave absorber | Δ | X | X | ◯ | X |
| Hardness of radio wave absorber | 40 | 40 | 40 | 40 | 78 |
| Thickness of radio wave absorber (mm) | 0.285 | 0.285 | 0.285 | 0.285 | 0.285 |
| Stickiness of radio wave absorber | ◯ | ◯ | ◯ | ◯ | ◯ |
| Radio wave absorption ratio | 0.22 | 0.22 | 0.22 | 0.22 | 0.23 |
| Tackiness of thermosetting adhesive sheet | Present | Present | Present | Absent | Present |
| Tackiness strength of thermosetting adhesive sheet (N) | 0.67 | 0.67 | 0.67 | 0.00 | 0.67 |
| Positioning accuracy of adhesive sheet | ◯ | ◯ | ◯ | X | ◯ |
| Resistance to bending | ◯ | ◯ | ◯ | ◯ | ◯ |

As seen in Table 1, in all of Examples 1 to 4, the resistance to bending, the dispersity of Sendust and the sheet processability were excellent. Also, it was possible to position the radio wave absorber on a flexible cable. Furthermore, the curable resin composition layer of the radio wave absorber provided no stickiness, thus being easy to handle.

On the other hand, in Comparative Example 1, the content ratio of Sendust was low and thus the relative amount of the polymer was excessively large. Therefore, the Sendust-containing curable resin composition layer was somewhat sticky, thus being difficult to handle.

In Comparative Example 2, charging the whole amount of Sendust at one time resulted in the insufficient dispersity of Sendust and sheet processability.

In Comparative Example 3, the average particle diameter of Sendust was too small and thus the dispersity of Sendust and the sheet processability were poor.

In Comparative Example 4, the average particle diameter of Sendust was too large and thus the dispersity of Sendust was not very good and the sheet processability was poor.

In Comparative Example 5, the thermosetting adhesive layer did not have tackiness and thus the resulting radio wave absorber did not have tackiness. Therefore, the positioning (temporary fixation) of the radio wave absorber on the flexible cable was impossible.

In Comparative Example 6, the content ratio of Sendust was too large and thus the dispersity of Sendust and the sheet processability were poor.

Figure 3:
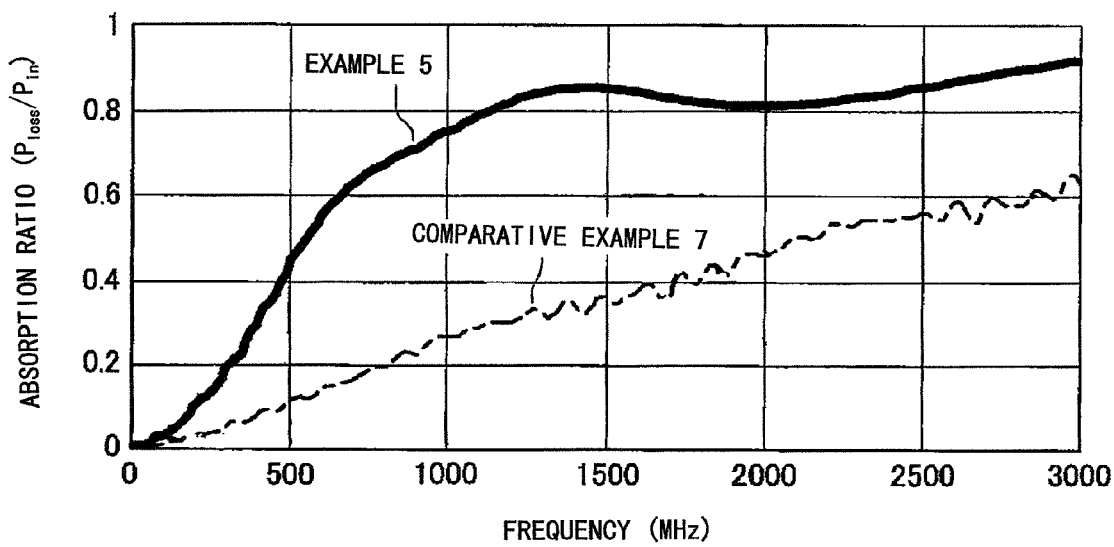
FIG. 3 is a graph showing the absorbance profile of the radio wave absorber according to the embodiment described below.
Figure 4:
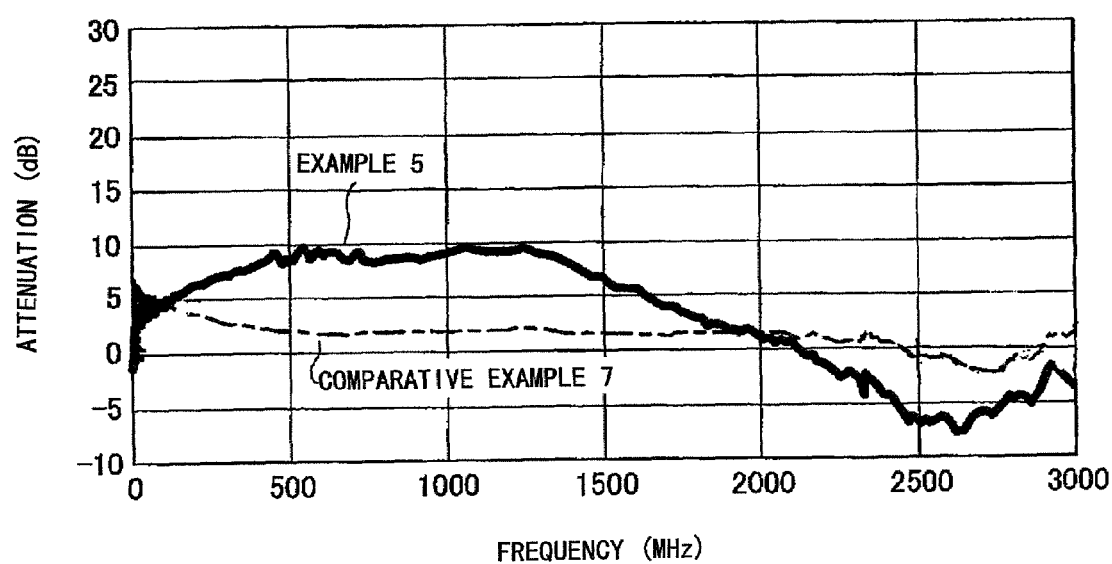
FIG. 4 is a graph showing the transmission profile of the radio wave absorber according to the embodiment described below.

In addition, FIGS. 3 and 4 respectively show the comparison results of the absorption profile and the transmission profile using the radio wave absorber, shown in FIG. 2, obtained by mounting a laminated film 3 consisting of a second adhesive layer 4, a metal layer 5 and an insulating layer 6 on the curable resin composition layer 2 formed on the thermosetting adhesive layer 1.

In the laminated film 3 used in Example 5, EMMA having a thickness of 30 μm was used as the second adhesive layer 4, a vapor-deposited aluminum thin film having a thickness of 400 Å was used as the metal layer 5, and CPP having a thickness of 20 μm was used as the insulating layer 6.

Furthermore, as Comparative Example 7, the radio-wave-absorbing body obtained by laminating a PET film on the curable resin composition layer 2 of the radio-wave-absorbing body shown in FIG. 1 was used.

As seen in FIGS. 3 and 4, a laminated film mounted on the radio wave absorber can shield against incident electromagnetic waves partially, thereby improving the electromagnetic-wave-absorbing performance and enhancing the shielding performance.

The invention claimed is:

1. A radio wave absorber comprising a thermosetting adhesive layer that is cured into a flexible material through heating or other treatments, and a curable resin composition layer impregnated with magnetic particles of a metal or a metal oxide that is cured into a flexible material through heating or other treatments, wherein the curable resin composition layer is formed on either surface of the thermosetting adhesive layer, wherein the thickness of the curable resin composition layer is in the range of 100 to 500 μm.

2. The radio wave absorber according to claim 1, wherein the thermosetting adhesive layer has some tackiness.

3. The radio wave absorber according to claim 1, wherein the average particle diameter of the magnetic particles of a metal or a metal oxide is in the range of 30 to 100 μm.

4. The radio wave absorber according to claim 1, wherein the content ratio of the magnetic particles of a metal or a metal oxide in the curable resin composition layer is in the range of 50 to 85 wt %.

5. The radio wave absorber according to claim 1, wherein the thickness of the thermosetting adhesive layer is in the range of 10 to 100 μm.

6. The radio wave absorber according to claim 1, wherein the curable composition contains modified-silicone-type, silicone-type, urethane-type or polyisobutylene-type polymer.

7. The radio wave absorber according to claim 1, wherein the curable resin composition layer is formed of a nonsolvent-type, curable liquid composition containing Sendust as the magnetic particles.

8. The radio wave absorber according to claim 1, wherein the hardness of the curable resin composition measured according to JIS K6253 (Type A) after the composition is cured through heating or other treatments is in the range of 20 to 50°.

9. The radio wave absorber according to claim 1, wherein a laminated film obtained by laminating a second adhesive layer and a metal layer is placed on the curable resin composition layer.

10. The radio wave absorber according to claim 9, wherein an insulating layer is attached onto the surface of the metal layer that is not facing the second adhesive layer.

11. The radio wave absorber according to claim 9, wherein the second adhesive layer is formed of a thermoplastic resin or a thermosetting resin.

12. The radio wave absorber according to claim 9, wherein the metal layer is an aluminum thin film.

13. The radio wave absorber according to claim 1, wherein a metal layer is mounted on the curable resin composition layer.

* * * * *